United States Patent [19]

Schwendtner et al.

[11] 4,454,471
[45] Jun. 12, 1984

[54] ELECTRONIC ARRANGEMENT FOR DETERMINATION OF REACTIVE POWER

[75] Inventors: Manfred Schwendtner, Schwarzenbruck; Günter Steinmüller, Nuremberg, both of Fed. Rep. of Germany

[73] Assignee: Siemens Aktiengesellschaft, Fed. Rep. of Germany

[21] Appl. No.: 321,273

[22] Filed: Nov. 13, 1981

[30] Foreign Application Priority Data

Nov. 17, 1980 [DE] Fed. Rep. of Germany ....... 3043303

[51] Int. Cl.³ .................. G01R 11/16; G01R 21/06
[52] U.S. Cl. ................................. 324/141; 324/107
[58] Field of Search ............................ 324/141, 107

[56] References Cited

U.S. PATENT DOCUMENTS

| 3,286,178 | 11/1966 | Ultcht . | |
|---|---|---|---|
| 4,092,590 | 5/1978 | Watanabe | 324/107 |
| 4,131,847 | 12/1978 | Kohga et al. | 324/141 |
| 4,378,524 | 3/1983 | Steinmüller | 324/107 |

FOREIGN PATENT DOCUMENTS

| 2063105 | 6/1972 | Fed. Rep. of Germany . | |
|---|---|---|---|
| 2065924 | 3/1977 | Fed. Rep. of Germany | 324/141 |
| 2731658 | 1/1979 | Fed. Rep. of Germany . | |
| 2747385 | 4/1979 | Fed. Rep. of Germany . | |

OTHER PUBLICATIONS

Elektronik, vol. 28, No. 8, Apr. 19, 1979.

Primary Examiner—Stewart J. Levy
Attorney, Agent, or Firm—Scully, Scott, Murphy & Presser

[57] ABSTRACT

An electronic arrangement for determination of reactive power, including two transducers delivering at their outputs measuring voltages proportional to supply current and supply voltage. An additional phase shift of 90° between the two measuring voltages is produced by phase-shifting elements. A signal proportional to reactive power is produced in a following multiplier element. To preclude as far as possible variation of amplitude and phase shift occurring on frequency fluctuation in a frequency range close to rated frequency of the power supply, an all-pass is connected as a phase-shifting element ahead of each of the two respective inputs of the multiplier element whereby one all-pass is designed to produce a phase shift of +45° and the other all-pass is designed to produce a phase shift of −45° at the rated frequency of the power supply.

6 Claims, 4 Drawing Figures

ELECTRONIC ARRANGEMENT FOR DETERMINATION OF REACTIVE POWER

BACKGROUND OF THE INVENTION

1. Field of the Invention

The present invention relates to an electronic arrangement for the determination of reactive power, consisting of two transducers which are provided for connection to an electrical power supply, delivering at their outputs measuring voltages proportional to the power supply current and the power supply voltage; a multiplier element with two inputs for the processing of the two measuring voltages and delivering at its output a signal proportional to the reactive power, as well as including at least one phase shifting element connected to the input of the multiplier element for the generation of an additional phase displacement of 90° between the measuring voltages.

2. Discussion of the Prior Art

Arrangements of that type are commercially obtainable as reactive power measuring apparatuses for alternating current voltage. Hereby, one input of the multiplier element has an RC element connected ahead thereof as a phase shifting element for the generation of an additional phase displacement of 90°. This, however, during frequency changes in the power supply will lead to a not insignificant falsification in the amplitude of the measuring voltage passing the phase shifting element as well as to a phase displacement deviating from 90°, since these phase shifting elements evidence a frequency-dependent attenuation as well as also a frequency-dependent phase shifting. Thereby, during frequency changes in the alternating-current voltage power supply there appears an increased, frequency-dependent measuring error.

For example, from W. Baiers, published "Elektronik Lexikon", 1974, Franckh'sche Verlagsverhandlung, Stuttgart, page 20, there is known the existence of an all-pass transducer. Such an all-pass transducer represents an electrical quadripole whose attenuation characteristic is frequency-independent within wide ranges, which means that frequency changes will not cause amplitude errors, in which the occasioned phase shift is always frequency-dependent.

SUMMARY OF THE INVENTION

The invention, accordingly, has as its object the provision of an arrangement of the above-mentioned type in which the measurement error will remain small and essentially constant also during the occurance of frequency changes in the power being supplied.

The foregoing object is inventively achieved in that both inputs of the multiplier element have each an all-pass transducer connected ahead thereof as a phase shifting element whereby, at the rated frequency of the power supply, one will produce a phase shift of $\phi = +45°$ and the other a phase shift of $\phi = -45°$. Through the action of the two all-pass transducers, as desired, produced between the two measuring voltages which are to be multiplied is a phase shift of 90°. Since both all-pass transducers within the range of possible frequency changes will not cause any frequency-dependent amplitude change, there will not occur any falsification of the amplitude through the all-pass transducers. Above all, the two all-pass transducers evidence in the range of the rated frequency of the power being supplied a frequency-dependent phase shift; however, this frequency dependence is so effected that a reduction in the absolute value of the phase shift occasioned through an all-pass transducer is almost completely compensated for by an increase in the absolute value of the phase shift occasioned by the other all-pass transducer. In a graphic representation of the phase shift occasioned through the two all-pass transducers in dependence upon the frequency, the curve plots associated with the two all-pass transducers thus follow at the same distance to each other in the vicinity of the rated frequency. Thereby, the inventive arrangement in addition to the avoiding of an amplitude error, also extensively precludes an angular error, since the angular difference, notwithstanding the frequency dependency of the phase shift of both all-pass transducers consists, at least within a range around the rated frequency will always be 90°. A further advantage consists of in that the angular difference of 90° will also be maintained when the electrical properties of the components of the two all-pass transducers, for example, due to alterations or changes in the environmental temperature, will uniformly vary. The manner in which two all-pass transducers are distributed to the two inputs of the multiplier element is basically irrelevant. An exchange of an all-pass transducer which at rated frequency will occasion a phase shift of $\phi_2 = +45°$ with an all-pass transducer which at a rated frequency will occasion a phase shift of $\phi = -45°$, will at the output of the multiplier element, sense merely a reversal in the sign of the reactive power-proportional signal.

A preferred embodiment of the invention consists of in that the input terminal of an all-pass transducer which effects a phase shift of $\phi_1 = -45°$ is connected through a resistor with the inverting input of an operational amplifier, whose output which is connected to the output terminal is similarly connected through a resistor of the same magnitude with the inverting input; that the input terminal is further connected through another resistor to the non-inverting input of the operational amplifier, which is concurrently connected through a condenser with the reference potential, whereby for the resistance value R of the further resistor and the capacitance C of the condenser there is valid the relationship of $\phi_1 = -2 \cdot \arctan(2\pi f_0 CR)$ wherein $f_0$: rated frequency of the power supply). That type of an all-pass transducer for a phase shift of $\phi_1 = -45°$ is producible at low cost from commercially available components.

A further preferred embodiment consists of in that the input terminal of the one all-pass transducer effecting a phase shift of $\phi_2 = +45°$ is connected through a resistor with the inverting input of an operational amplifier, whose output which is connected to the output terminal is similarly connected through a resistor of the same size with the inverting input; that the input terminal further is connected through a condenser to the non-inverting input of the operational amplifier, which is concurrently connected through another resistor with the reference potential, whereby for the resistance value R of the further resistor, and the capacitance C of the condenser there is valid the relationship $\phi_2 = 2 \cdot \arctan 1/(2\pi f_0 CR)$ wherein $f_0$: the rated frequency of the power supply).

The inventive arrangement can find application as the components of a reactive energy meter whereby the reactive power-proportional signal at the output of the multiplier element is conducted through a quantitizer to an integrating counting mechanism with display. Produced thereby is a reactive energy meter whose measurement error is almost frequency-independent.

The inventive arrangement can further be utilized for determining the reactive power in a three-phase current system, wherein each phase of the three-phase system has such an arrangement associated therewith, and the reactive power-proportional signals at the output of the multiplier elements are added in a summing element.

The inventive arrangement can further be advantageously utilized as components in a three-phase reactive energy meter wherein each phase of the three-phase current system has such an arrangement associated therewith and the signals at the outputs of the multiplier elements which are proportional to the reactive power are added in a summing element, and in which the output signal of the summing element is conducted through a quantitizer to an integrating counting mechanism with display. That type of three-phase reactive energy meter evidences practically no longer any frequency-dependent measuring errors.

BRIEF DESCRIPTION OF THE DRAWINGS

Reference may now be had to the following detailed description of a preferred exemplary embodiment of the invention, taken in conjunction with the accompanying drawings; in which.

DETAILED DESCRIPTION

Figure 1:
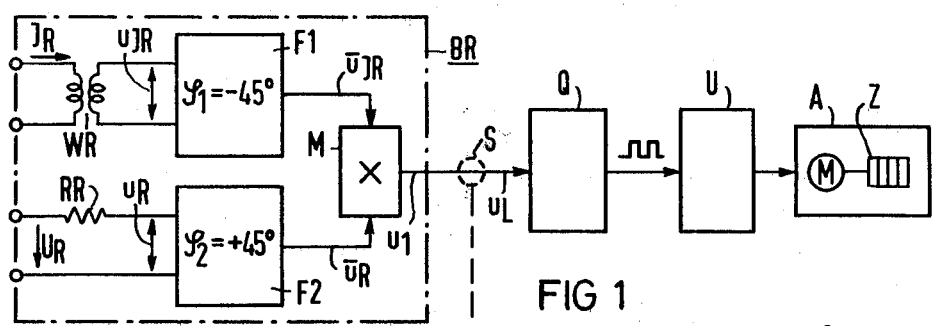
FIG. 1 illustrates a schematic circuit block diagram of an electronic arrangement for the determination of the reactive power in alternating-current voltage supply network.

Illustrated in the upper portion of FIG. 1 within the block designated by BR is an electronic arrangement for determining the reactive power in an alternating-current voltage supply network. The alternating-current voltage hereby corresponds to the phase R of a three-phase current network. For determining the network current $I_R$ there is utilized a transducer WR, which renders available at the output thereof a measuring voltage $U_{IR}$ proportional to the power supply current at the input resistance of an all-pass F1 providing at the rated frequency of the alternating-current voltage a phase shift of $\phi_1 = -45°$. The transducer WR can also be formed as a current transformer with its load resistance. As transducer for determining the power supply voltage $U_R$ there serves a resistor RR through which there is connected to the power supply an all-pass F2 producing a phase shift of $\phi_2 = +45°$ at the rated frequency of the alternating-current voltage. At the input resistance of this all-pass F2 there is thus formed the measuring voltage $U_R$ proportional to the power supply voltage $U_R$. The input resistance of the all-pass F2 together with the variable resistor RR forms a voltage divider which is utilized as a voltage transformer. In lieu thereof there can be also utilized a conventional voltage transformer based on the induction principle. At the output of the two all-pass F1 and F2 there appear the two measuring voltages $\overline{U}_{IR}$ and $\overline{U}_R$, wherein the rated frequency of the first is phase-displaced by $-45°$ with respect to the input-sided measuring voltage $U_{IR}$, the last by $+45°$ with respect to the input-sided measuring voltage $U_R$. Through the two all-passes F1 and F2, the two measuring voltages $U_{IR}$ and $U_R$ which are proportional to the power supply current and the power supply voltage thereby achieve a relative phase shift of 90°. The phase displaced measuring voltages $\overline{U}_{IR}$ and $\overline{U}_R$ are conducted to the inputs of an electronic multiplier element M. The electronic multiplier element caan be constructed, for example, as a time-division multiplier. Such time-division multipliers are known, for example, from the journal "Technisches Messen atm" 1978, Volume 11, page 408, or from German Laid-open Patent Application No. 27 47 385. A signal U1 is present at the output of the multiplier element M, whose direct-current voltage medium value is proportional to the product $U_R \cdot I_R \cdot \sin\phi$, in effect, proportional to the reactive power of the appliance connected thereto.

The reactive power determining arrangement contained in block BR can be utilized as the components of a reactive energy meter. For this purpose the output signal U1 of the multiplier M is conducted to a quantitizer Q. The quantitizer delivers a pulse train at its output, whose frequency is proportional to the determined reactive power. Such quantitizers Q are also known from the previously mentioned literature "Technisches Messen atm", 1978, Volume 11, pages 408-410, or from German Laid-open Patent Application No. 27 47 385. This pulse train is conducted for frequency reduction through a frequency divider U to an integrating counting mechanism with display A which, for example, can include a stepping motor M and a roller counting mechanism Z driven by this motor.

In order to determine the reactive power in a three-phase current network with the network phases R, S and T, each of these phases has associated therewith a block of similar construction as the previously described block BR. This is also illustrated in FIG. 1. Additionally to the block BR, there are illustrated herein the blocks BS and BT associated with the network phases S and T in phantom lines. In this instance, it is always necessary to add the output signals U1, U2 and U3 of the multiplier elements M, M' and M" in a summing point S into the summing signal $U_L$. The direct-current voltage median value of the summing signal $U_L$ is proportional to the reactive power taken from the three-phase current system.

In order to construct a three-phase reactive energy meter it is merely necessary to only conduct the summing signal $U_L$ through the quantitizer Q and the frequency divider U to the integrating counting mechanism with display A.

Figure 2:
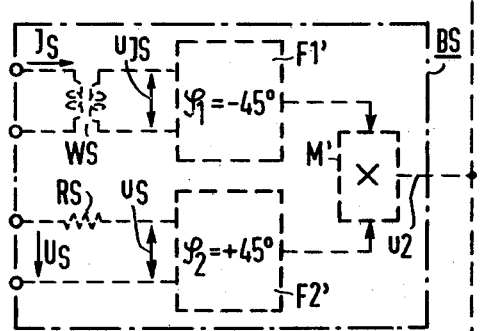
FIG. 2 illustrates an exemplary embodiment of an all-pass transducer.
Figure 2:
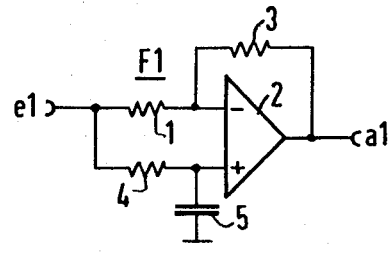
Figure 3:
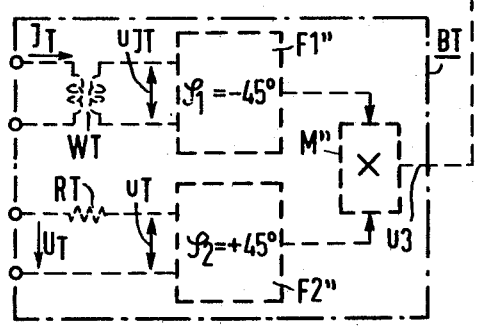
FIG. 3 illustrates an embodiment of another all-pass transducer.
Figure 3:
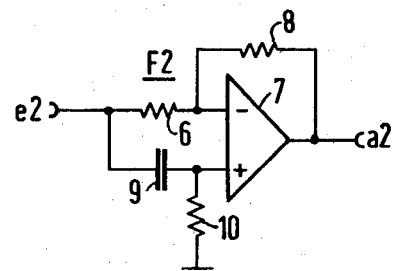
Figure 4:
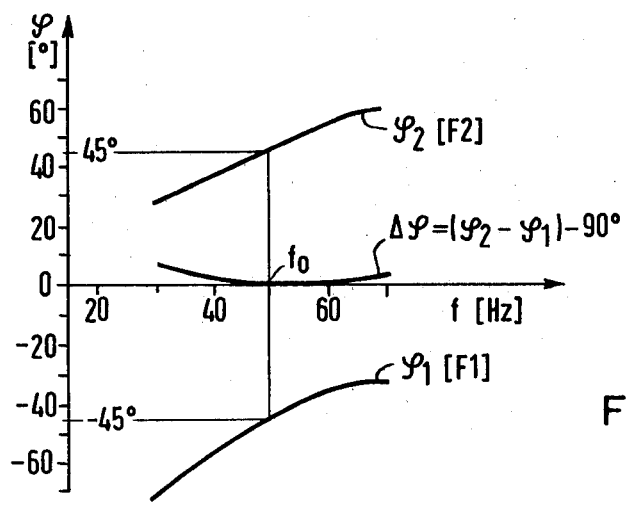
FIG. 4 is a graph illustrative of the functions of the all-pass transducers.

Illustrated in FIG. 2 is an exemplary embodiment of an all-pass transducer F1 by means of which there can be produced a phase shift $\phi_1 = -45°$. Hereby the input terminal e1 is connected through a resistor 1 with the inverting input of an operational amplifier 2. The output of this operational amplifier 2 is connected with the output terminal a1 of the all-pass F1. The output signal of the operational amplifier 2 is reconveyed through a resistor 3 to the inverting input. The resistors 1 and 3 have the same resistance values. The input terminal e1 is further connected through an additional resistor 4 to the non-inverting input of the operational amplifier 2, which is connected through a condenser 5 with the reference potential. For the calculation of the further resistor 4 and the condenser 5 there is valid the relationship $\phi_1 = -45° = -2 \cdot \arctan(2\pi f_0 CR)$. In a calculating example for a rated frequency for the network of $f_0 = 50$ Hz there were obtained the following values:

Resistor 1: 56 kOhm
Resistor 3: 56 kOhm
Resistor 4: 59.9 kOhm
Condenser 5: 22 nf In FIG. 3 there is illustrated an exemplary embodiment of an all-pass F2 with which there can be effected a phase shift of $\phi_2 = +45°$. The input terminal e2 is hereby connected through a resistor 6 with the inverting input of an operational amplifier 7, whose output terminal is in connection with the output terminal a2 of the all-pass. The output signal of the operational amplifier 7 is reconveyed through a resistor 8 to the inverting input. The input terminal e2 is further connected through a condenser 9 to the non-inverting input of the operational amplifier 7 which is connected through a further resistor 10 with the reference potential. For the calculation of the condenser 9 and the further resistor 10 there is valid the relationship $\phi_2 = +45° = 2\cdot\arctan 1/(2\pi f_0 CR)$. Within the scope of a calculating example for a rated frequency for the network of $f_0 = 50$ Hz there are obtained hereby the following values:

Resistor 6: 56 kOhm
Resistor 8: 56 kOhm
Condenser 9: 100 nf
Resistor 10: 76.8 kOhm Finally, in FIG. 4 represented as a function of the frequency of the supply network there is the phase shift $\phi_1$ of an all-pass F1 effecting at a rated frequency of $f_0$ of 50 Hz precisely a phase shift of $-45°$, the phase shift $\phi_2$ by an all-pass F2 at a rated frequency of $f_0$ of 50 Hz precisely with a phase shift of $+45°$, and finally the function $\Delta\phi = (\phi_2 - \phi_1) - 90°$, which represents the frequency dependency of the encountered angular error for the inventive arrangement. Hereby is obtained that, even a frequency change of 5%, in effect, within a frequency range of between 47.5 and 52.5 Hz, the maximum angular error will not exceed 2 minutes. This means that even at significant changes in the power supply frequency there will occur almost no frequency-dependent phase error or angular error.

What is claimed is:

1. An electronic arrangement for determination of reactive power, including two transducers for connection to an electrical power supply having two outputs delivering measuring voltages respectively proportional to the supply current and supply voltage; two all-pass phase-shifter elements connected to the two outputs of the two transducers such that at the rated frequency of the power supply, one all-pass produces a phase shift of $\phi_2 = +45°$ and the other all-pass a phase shift of $\phi_1 = -45°$; and a multiplier element means, coupled to said two all-pass phase shifter elements, for multiplying the two outputs of said two all-pass phase shifter elements to produce an output signal proportional to the reactive power therethrough.

2. Arrangement as claimed in claim 1, said all-pass effecting a phase shift of $\phi_1 = -45°$ having an input terminal connected through a resistor with the inverting input of an operational amplifier, the output of which having an output terminal connected through a resistor of the same size to the inverting input, said input terminal being connected through another resistor with the non-inverting input of the operational amplifier; and a condenser connecting said non-inverting input with the reference potential whereby for the resistance value of further resistor and the capacitance of the condenser there applies the relationship $\phi_1 = -2\cdot\arctan(2\pi f_0 CR)$ wherein $f_0$: rated frequency of the power supply.

3. Arrangement as claimed in claim 1 or 2, said all-pass effecting a phase shift of $\phi_2 = +45°$ having an input terminal connected through a resistor with the inverting input of an operational amplifier, the output of which having an output terminal connected through a resistor of the same size to the inverting input; and a condenser connected between the inverting input of the operational amplifier and the input terminal, said condenser being concurrently connected through a further resistor with the reference potential whereby for the resistance value of said further resistor and the capacitance of the condenser there applies the relationship $\phi_2 = 2\cdot\arctan 1/(2\pi f_0 CR)$ wherein $f_0$: rated frequency of the power supply.

4. Arrangement as claimed in claim 1, for use as the components of a reactive energy meter, wherein the reactive power-proportional signal of the multiplier element output is conducted through a quantitizer to an integrating counting mechanism with a display.

5. Arrangement as claimed in claim 1, for determining the reactive power in a three-phase current system, each phase of said system having one said arrangement associated therewith; and a summing element adding the reactive power-proportional signals from the outputs of said multiplier elements.

6. Arrangement as claimed in claim 1, for use as the components of a three-phase current reactive energy meter, each phase of the three-phase system having one said arrangement associated therewith; a summing element adding the reactive power-proportional signals of said multiplier elements, and the output signal of the summing element being conducted through a quantitizer to an integrating counting mechanism with a display.

* * * * *